United States Patent [19]

Ludwick et al.

[11] Patent Number: 4,663,583
[45] Date of Patent: May 5, 1987

[54] AUTOMATICALLY VARIABLE PHASE CHARACTERISTIC ALL-PASS CIRCUIT

[75] Inventors: John J. Ludwick, Hampton; Edward S. Parsons, Londonderry, both of N.H.

[73] Assignees: AT&T Company; AT&T Bell Laboratories, both of Murray Hill, N.J.

[21] Appl. No.: 866,901

[22] Filed: May 27, 1986

[51] Int. Cl.$^4$ .......................... H03H 7/03; H04B 3/04
[52] U.S. Cl. .................... 323/217; 323/218; 375/12; 333/18; 333/28 R
[58] Field of Search ............ 323/212, 217, 218, 219, 323/315, 316; 375/11–12; 455/276; 307/262, 511, 512; 328/155; 330/107; 333/18, 27, 28 R

[56] References Cited

U.S. PATENT DOCUMENTS

| 3,808,517 | 4/1974 | Fletcher et al. | 323/217 |
| 4,087,737 | 5/1978 | DeGennaro | 323/217 X |
| 4,273,963 | 6/1981 | Seidel | 333/28 R |
| 4,413,240 | 11/1983 | Dyke | 333/28 R |
| 4,455,539 | 6/1984 | Wurzburg | 336/28 R |
| 4,488,126 | 12/1984 | Suthers | 333/28 R |

OTHER PUBLICATIONS

*Analog Filter Design* by M. E. Van Valkenburg, Holt, Rinehart and Winston, 1982, Chapter 4, Section 4.5.

*Primary Examiner*—Peter S. Wong
*Attorney, Agent, or Firm*—Richard B. Havill

[57] ABSTRACT

An automatically variable all-pass circuit includes a variable impedance circuit for changing the shape of the phase characteristic of the output signal of the all-pass circuit as a function of the amplitude of the output signal of the circuit.

5 Claims, 8 Drawing Figures

AUTOMATICALLY VARIABLE PHASE CHARACTERISTIC ALL-PASS CIRCUIT

BACKGROUND OF THE INVENTION

This invention relates to an all-pass circuit which may be described more particularly as an automatically variable all-pass phase equalizer circuit.

In digital transmission systems, such as telecommunication systems, the cable length is too long for end-to-end signal transmission without equalization, amplification and regeneration. Regenerators are interposed along the cable to offset the effects of attenuation, as a function of frequency, in the cable conductors. Typically regenerator circuitry includes an automatic line buildout (ALBO) circuit. The function of the ALBO circuit is to add shaped loss, if required, to the cable section so that the regenerator fixed gain equalizer can compensate for a predetermined loss shape. If the cable section is short, most of the loss shape is provided by the ALBO circuit. For longer cable sections, the ALBO adds less and less shaped loss to the incoming signal.

In the longer cable lengths in which the ALBO has minimum effect, the cable pair introduces excessive phase distortion that cannot be compensated by a fixed equalizer. The resulting phase distortion causes a performance degradation that can be minimized by an all-pass circuit which is inserted in tandem with the ALBO circuit to impart phase equalization to the equalized signal.

One type of all-pass circuit is an active filter in which attenuation is unchanged throughout the desired frequency range but phase equalization is provided to complement the phase distortion of the long cable length throughout the desired frequency range. One prior art all-pass active filter circuit has one pole and one zero on the real axis. The pole and zero are equally distant from and in opposite directions from the origin. A transfer function for this circuit is $$\frac{V_2}{V_1} = \frac{s - 1/RC}{s + 1/RC} \quad . \tag{1}$$

Classically all-pass circuits are fixed value compromise designs that do not provide a good match for both medium and long cable lengths without changing component values. The component values would have to be selected at the field site based upon the cable length. In commercial practice this is not an acceptable procedure. The compromise result, together with the need to custom select components for different length cable sections, suggests that there may be a better way.

Thus there is a problem with the prior art fixed component all-pass active filter circuit. It provides only a single compromise phase equalizer for various cable lengths and does not provide any compensation for phase variations induced by temperature changes experienced by the cable.

SUMMARY OF THE INVENTION

The aforementioned problem is solved by an automatically variable all-pass circuit which includes a variable impedance circuit for changing the phase characteristic of the all-pass circuit as a function of the signal amplitude at the output of the complete equalizer.

BRIEF DESCRIPTION OF THE DRAWING

A better understanding of the invention may be derived by reading the subsequent detailed description with reference to the attached drawing wherein.

DETAILED DESCRIPTION

Figure 1:
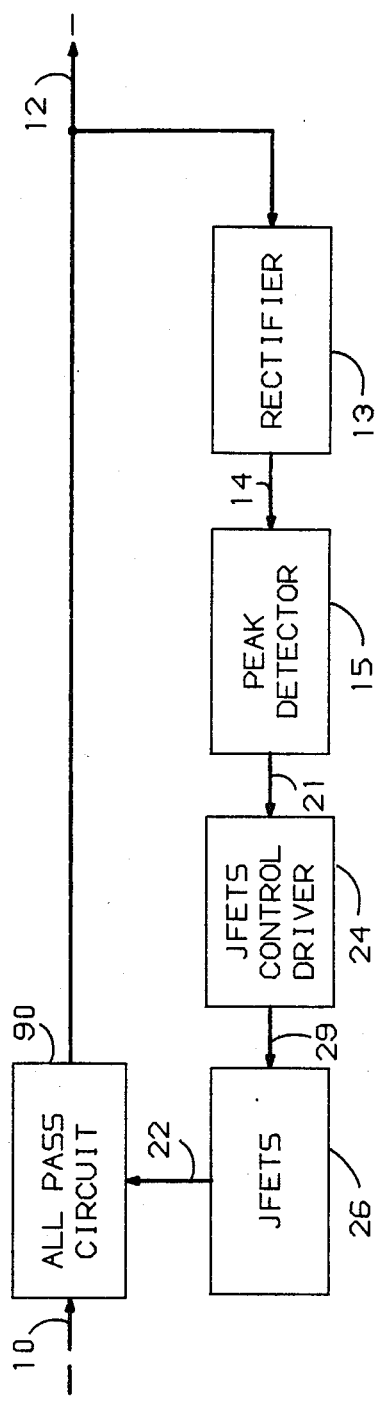
FIG. 1 is a block diagram of an automatically variable all-pass circuit.

Referring now to FIG. 1, there is shown a block diagram of an all-pass circuit 90 interconnected with feedback control circuitry for varying the phase shift of the all-pass circuit in response to the magnitude of the output signal from the all-pass circuit. The circuit 90 receives an input signal on an input lead 10 and produces an output signal, which has been phase equalized, on an output lead 12. A portion of the output signal is fed back though a full-wave rectifier 13, a peak detector 15, and a JFET control driver 24 to a variable impedance circuit 26 for controlling the phase shift introduced by the all-pass circuit 90.

Peak detector 15 produces on lead 21, a control signal, or d.c. level, which is inversely proportional to cable length and which can change very slowly depending upon temperature variations in a cable section through which the received signal is being transmitted before reaching the input lead 10 to the all-pass circuit.

JFET control driver 24 responds to the slowly changing d.c. level on the lead 21 by producing junction field-effect transistor (JFET) control signals that automatically change the impedance of the variable impedance circuit 26. The resulting change of impedance in turn causes a change in the phase shift characteristic in the all-pass circuit 90.

Figure 2:
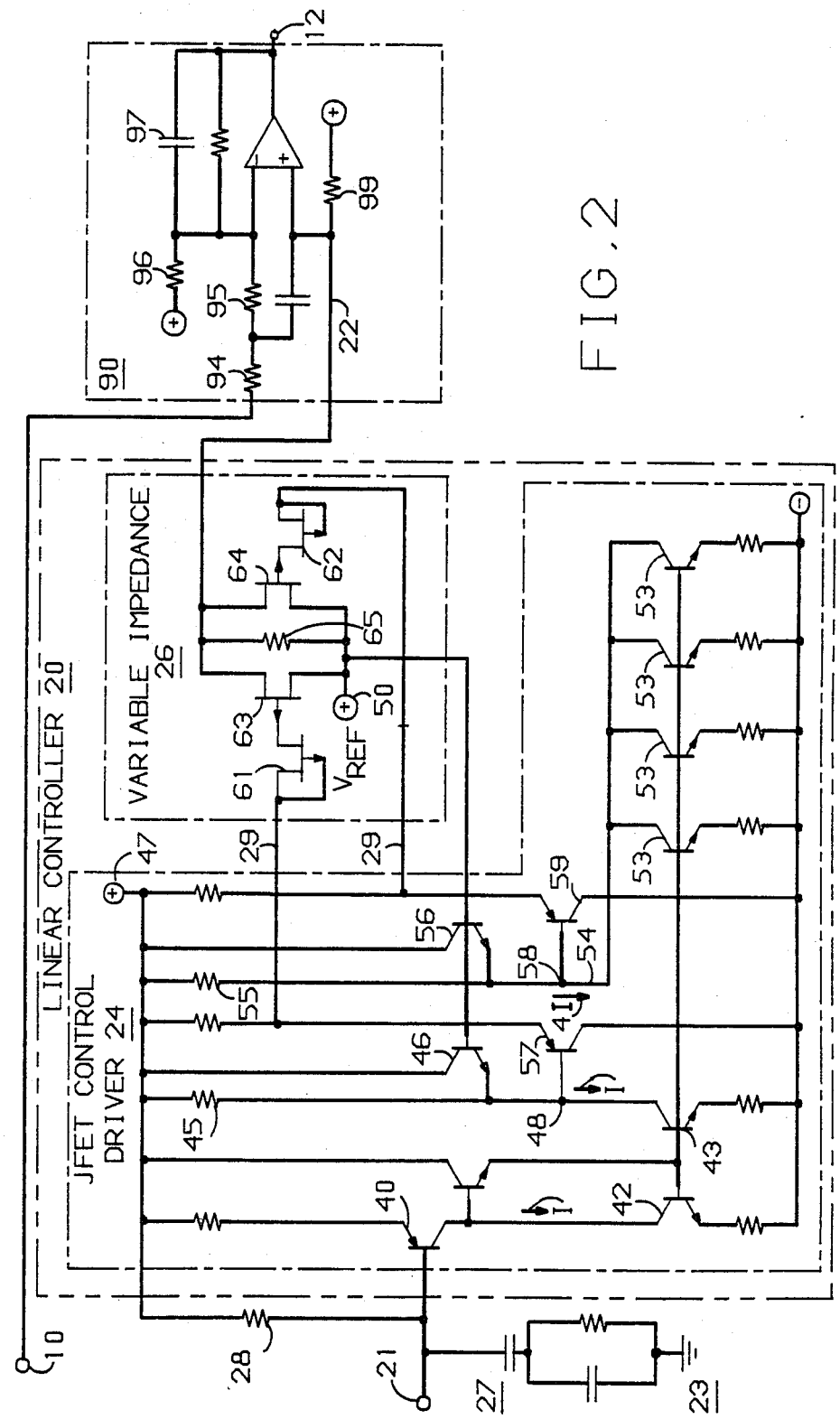
FIG. 2 is a schematic diagram of a wide range linear controller and the variable all-pass circuit.

Referring now to FIG. 2, there is shown in greater detail the circuitry of the linear controller 20 and the all-pass circuit 90. The linear controller is responsive to the control signal from the peak detector on input lead 21 for producing the correct impedance in the variable impedance circuit 26. The input control signal is applied between the input lead 21 and ground reference 23.

Linear controller 20 includes two major circuit configurations. One of those circuit configurations is a JFET control driver 24 that is responsive to the input control signal on lead 21 for producing the desired JFET control signals. In the exemplary embodiment of FIG. 2, there are two JFET control signals produced by the JFET control driver 24 on a pair of leads 29. The second circuit configuration is a variable impedance arrangement 26 that responds to the JFET control signals as a wide range linear controller which controls the magnitude of the signal on a lead 22.

The magnitude of the signal applied to the input lead 21 is a relatively stable or constant signal which falls within a relatively wide range of values. The range of signal magnitudes is determined by the attenuation per unit length of a cable section leading to the input lead 21, the length of that cable section, the ambient temperatures surrounding the cable section, and the performance of preceding electronic circuits. Most likely the input control signal between the lead 21 and the ground reference will fall in a range of 4.0–7.0 volts. The exact range of the actual voltage does not matter. It is important, however, to control the phase shift characteristic of the all-pass circuit relative to the magnitude of the input signal. Typically the phase shift in the fixed again equalizer and of a regenerator (not shown) is increased as the magnitude of the input signal is reduced and vice versa.

An input filter 27 and resistor 28 are connected with the input lead 21 for smoothing variations of the input signal.

A common-emitter connected transistor 40 is arranged for receiving on its base electrode the input signal occurring on the input lead 21. In response to variation of the input voltage, the transistor 40 produces a variable collector current I which is conducted into the input leg of a current mirror including transistors 42 and 43. The transistors 42 and 43 are designed alike so that the collector output current I of the transistor 43 has a magnitude equal to the magnitude of the input current I conducted into the collector of the transistor 42.

Current I, which is conducted to the collector of the transistor 43, also is conducted through a resistor 45 having a clamping transistor 46 connected thereacross. Voltage drop across the resistor 45 varies with the magnitude of current conducted therethrough. A bias supply 47 applies a constant voltage to one end of the resistor 45. All of the current I is conducted through the resistor 45 whenever the magnitude of the current is low and the voltage on a node 48 is proportional to that current. When the magnitude of the current I is large enough for the resulting voltage drop across the resistor 45 to turn on the transistor 46, that transistor shunts away any further increase in the current I. As a result the node 48 is clamped at the potential of 0.7 volts below $V_{REF}$. When the current I is low, the potential at the node 48 generally varies with the magnitude of the input control signal on the lead 21 until node 48 reaches the potential which turns on the transistor 46. The potential at node 48 is held substantially constant for any greater swing of the magnitude of the input signal applied to the input lead 21. The purpose of the clamping action of the transistor 46 is to avoid forward biasing the gate junctions in the JFETs. Without the clamp, large magnitude signals at the regenerator input result in a low d.c. voltage on the lead 21 and would cause such a low voltage on the lead 29 that the JFET gate junctions would defuse as the junctions are being forward biased.

Figure 3:
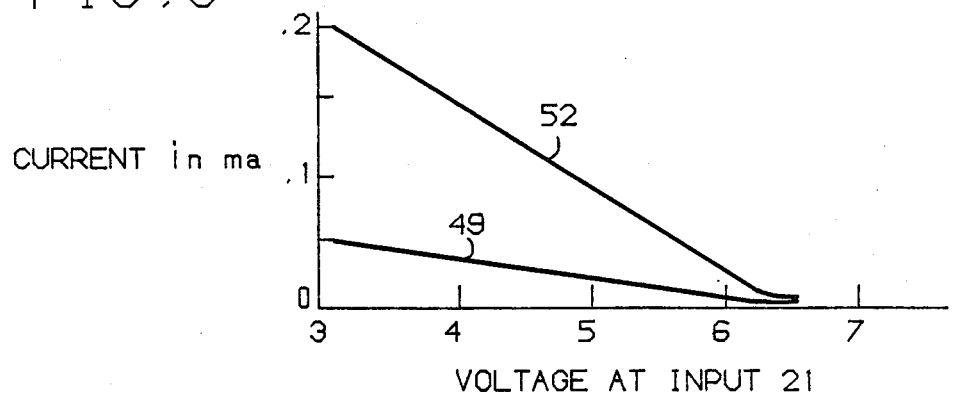
FIG. 3 is a plot of transfer characteristics showing currents conducted through separate paths in the controller in response to the magnitude of the input signal to the controller; .

Referring now to FIG. 3, there is shown a transfer characteristic 49 from the magnitude of the voltage applied to the input lead 21 to the magnitude of the current I. It is noted that the magnitude of the current I increases inversely with respect to the magnitude of the input control signal between the input lead 21 and reference ground 23 in FIG. 2.

In FIG. 2 another current source includes four transistors 53 which are connected as legs of the current mirror. The collectors of the transistors 53 are connected in a multiple arrangement to a common lead 54 which supplies a current 4I to a resistor 55 and a clamping transistor 56. Resistor 55 and transistor 56 are arranged to operate similar to the resistor 45 and transistor 46 just described. Because of the multiple current source arrangement, current supplied in the lead 54 has a magnitude equal to four times the magnitude of the current I. In FIG. 3 there is a transfer characteristic 52 from the voltage applied to the input lead 21 to the magnitude of the current 4I in FIG. 2. In the exemplary configuration, the resistors 45 and 55 have equal resistance. For small magnitudes of current, the currents I and 4I at the nodes 48 and 58, respectively, are conducted entirely through the resistors 45 and 55.

Figure 4:
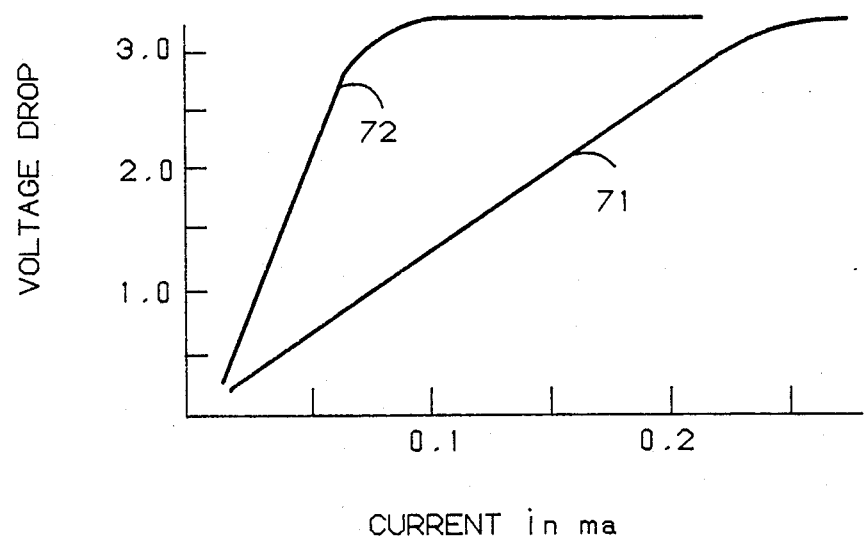
FIG. 4 is a plot of voltage drops produced across resistors in the controller as a function of current.

FIG. 4 presents curves 71 and 72 showing the voltage drops produced across the resistors 45 and 55, respectively, in response to the magnitudes of current that they conduct. In operation, the voltages produced on the nodes 48 and 58 in FIG. 2 are determined by the bias voltage 47 less the drop across the relevant resistor. As previously mentioned, the clamping transistors 46 and 56 limit the lowest possible voltage to insure that the JFETs are not damaged.

Figure 5:
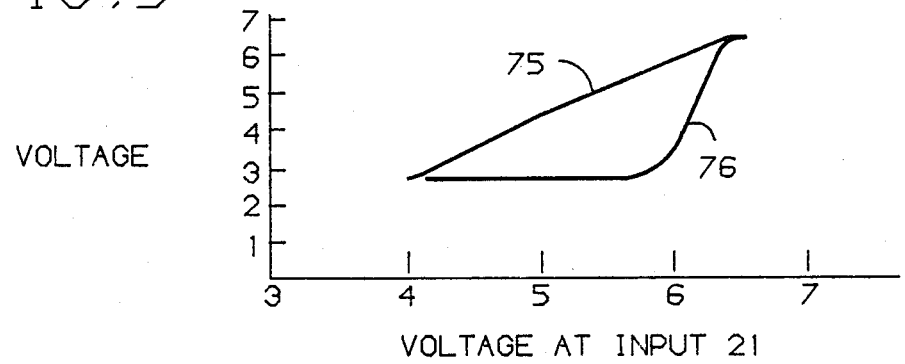
FIG. 5 is a plot of voltages produced at separate nodes in the controller in response to the magnitude of the input signal to the controller.

Referring now to FIG. 5, there are shown transfer characteristic curves 75 and 76 for the voltages at the nodes 48 and 58, respectively, as a function of the input control signal applied on the lead 21 of FIG. 2.

In FIG. 2, a pair of transistors 57 and 59, arranged as emitter-followers, transfer the voltages produced on the nodes 48 and 58, respectively, to and through the pair of leads 29 as the JFET control signals. These JFET control signals are applied to separate inputs of the variable impedance arrangement 26. The variable impedance arrangement 26 includes four junction field-effect transistors (JFETs) 61, 62, 63, and 64. JFETs 61 and 62 are diode connected and are arranged as high impedance gating devices between the leads 29 and the input gate electrodes of the JFETs 63 and 64, respectively. Drain-to-source paths of the JFETs 63 and 64 and a resistor 65 are connected in a parallel circuit combination between reference voltage $V_{REF}$ and the lead 22. Resistor 65 is included to limit the dynamic impedance range of the JFETs 63 and 64.

A wide range equivalent impedance is produced by the parallel combination of the JFETs 63 and 64. Both JFETs 63 and 64 have like characteristics, both physical and electrical, except that they are designed to have different minimum drain-to-source impedances. These different minimum drain-to-source impedances are achieved by different gate widths. For the exemplary embodiment, the minimum drain-to-source impedances of the JFETs 63 and 64 are selected to be 100 ohms and 400 ohms, respectively. Generally, the larger minimum drain-to-source impedance should be at least twice the value of the smaller minimum drain-to-source impedance so that their resulting individual impedances are different for any given input voltage applied to the lead 21.

Figure 6:
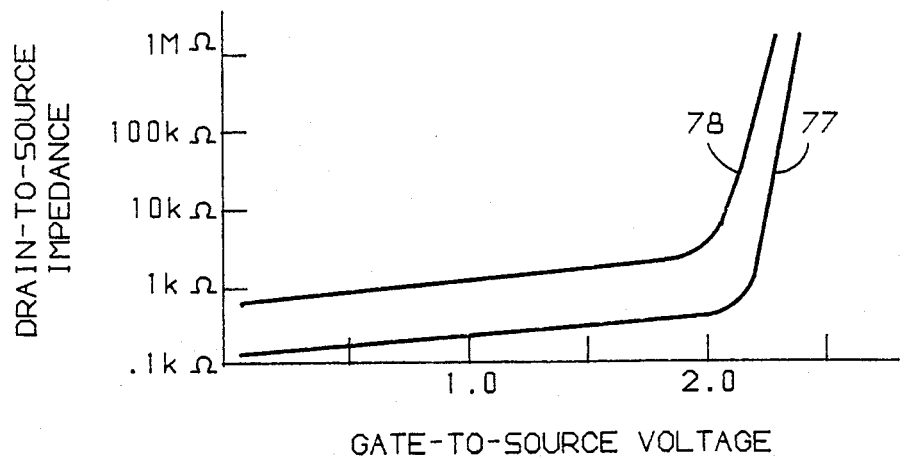
FIG. 6 is a plot of the drain-to-source impedances of junction field-effect transistors, used in the controller, as a function of their own gate-to-source voltages.

In FIG. 6, there is shown for the JFETs 63 and 64 relevant impedance curves 77 and 78 as a function of their respective input gate-to-source voltages.

Figure 7:
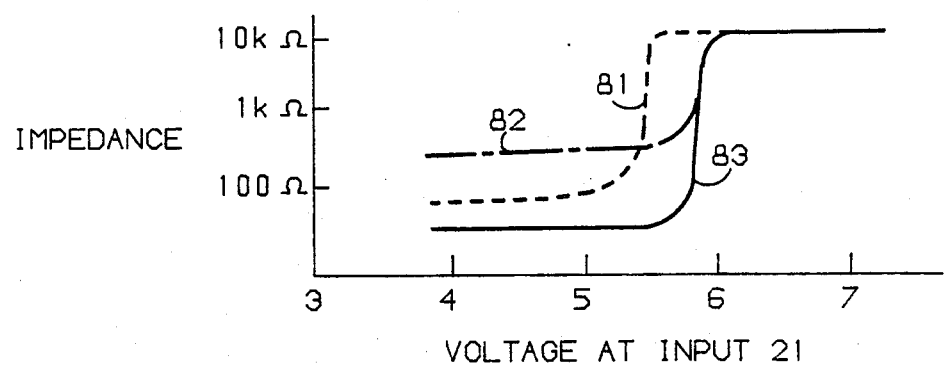
FIG. 7 is a plot of the individual impedances and the equivalent parallel impedance of the junction field-effect transistors as a function of the magnitude of the input signal to the controller.

In FIG. 7, the variable impedances 81 and 82 of the JFETs 63 and 64 together with the variable equivalent impedance 83 of the parallel combination are shown as functions of the input control signal applied to the input lead 21 of FIG. 2. As the equivalent impedance 83 of the parallel combination varies in FIG. 7, it is relatively linear over a wide range of the input voltage. The current conducted through the output lead 22 to the all-pass circuit 90 also varies linearly. Variations of the output current occur in response to any variation of the input control signal applied to the input lead 21. Signal linearity extends over a range that exceeds the range of the impedance of either of the JFETs 63 and 64 individually by a factor of approximately two to one.

Referring still to FIG. 2, there is shown an active circuit which is an example of an all-pass circuit 90 that is automatically controlled by the variable equivalent impedance of the JFET circuit 26 in the linear controller 20. When the all-pass circuit 90 is connected with the linear controller 20 at terminal 22, the variable equivalent impedance replaces the fixed resistor shown connected to the positive terminal in FIG. 4.28 of the text *Analog Filter Design* by M. E. VanValkenburg, Holt, Rinehart and Winston, 1982.

This replacement of the fixed resistor by the variable impedance 26 of FIG. 2 provides a new all-pass circuit having a characteristic in which the phase shift characteristic over the relevant frequency band varies as the variable impedance is varied. Signals, to be phase shifted by the circuit 90, are applied through the lead 10 and are outputted from the terminal 12. The output signal is phase shifted by an angle $\theta$ with respect to the input signal.

Figure 8:
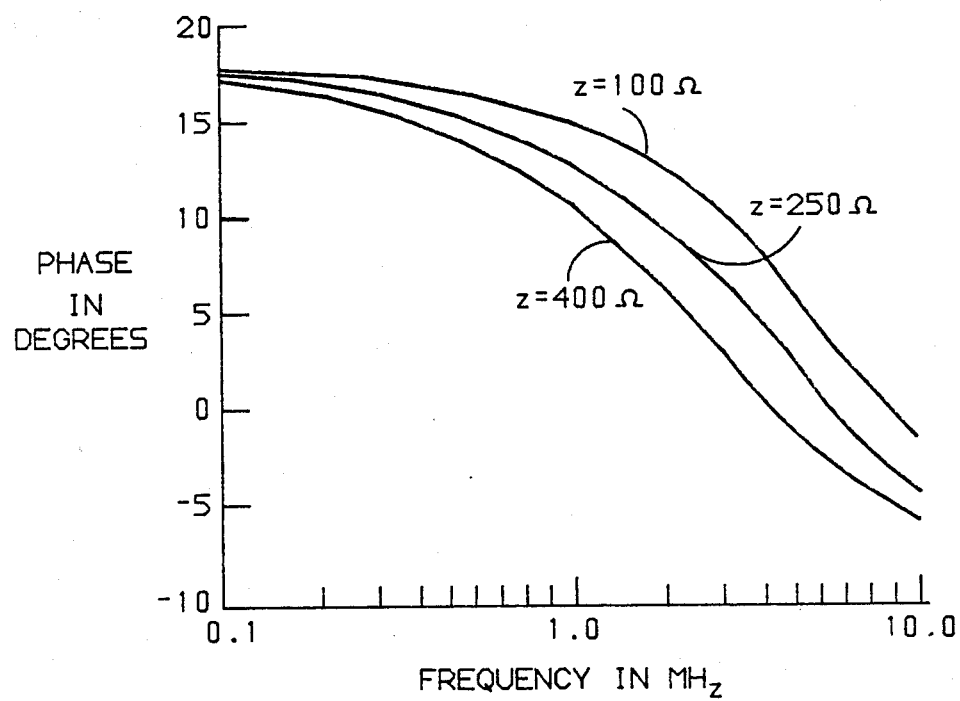
FIG. 8 is a plot of three phase shift versus frequency characteristics of the automatically variable all-pass circuit with a different value of control impedance, produced by the junction field-effect transistor circuit, used as the parameter for each curve.

In FIG. 8, there are three characteristic curves selected from a whole family of curves wherein the variable impedance parameter ranges from a low-value of 100 ohms to a high value of 400 ohms.

During operation of the digital transmission system using the automatically variable all-pass circuit, the pulse rate and therefore the transmission frequency is a fixed value which falls on the horizontal axis of FIG. 8. At that frequency the phase shift produced by the circuit 90 in FIG. 2 depends upon the magnitude of the variable impedance 26. As previously mentioned, the magnitude of the variable impedance is dependent upon the amplitude of the input voltage applied to the input lead 21.

Thus the amplitude of the input control signal, which is determined by (1) an output level being transmitted thereto from a prior regenerator, (2) the type and length of the connected cable, and (3) ambient temperature, automatically controls both the magnitude of the variable impedance and the phase-shift of the all-pass circuit.

Other configurations of the active all-pass circuit can be utilized in conjunction with the disclosed variable impedance arrangement. Additionally, other variable impedance arrangements can be used, as well. For instance, more JFET devices can be put in the parallel circuit of the variable impedance arrangement of FIG. 2. Different current ratios can be used in the control circuit. A specific arrangement can be selected from the available alternatives to accommodate a wide range of requirements for specific applications.

In the circuit 90 of FIG. 2, there are some additional circuit elements not disclosed by Van Valkenburg. A resistor 94 is inserted between the terminal 92 and the input resistor 95. A resistor 96 and a capacitor 97 are added in the feedback circuit. Resistors 94 and 96 provide for flat gain in the circuit 90. Capacitor 97 rolls off the flat gain at high frequencies to minimize the effect of open-loop amplifier gain and to minimize phase variations in closed-loop gain. Resistor 99 is effectively in parallel with resistor 65. Together the resistors 99 and 65 provide an upper limit to the variable impedance of the circuit 26. The value of the resistor 99 is chosen so that the circuit 90 provides optimum phase equalization for the full range of cable lengths.

The foregoing describes several embodiments of the subject invention. The described embodiments together with other embodiments made obvious in view thereof are considered to be within the scope of the appended claims.

What is claimed is:

1. An automatically variable phase control circuit comprising
   an all-pass circuit including means for receiving an input signal and producing an output signal that is phase shifted from the input signal;
   a variable impedance circuit;
   means responsive to the output signal for applying control signals to the variable impedance circuit and changing the magnitude of the variable impedance as a function of the amplitude of the output signal; and
   the all-pass circuit being responsive to the magnitude of the variable impedance for changing automatically its phase characteristic as a function of the amplitude of the output signal.

2. An automatic phase control circuit in accordance with claim 1 wherein
   the all-pass circuit is an active circuit configuration,
   the variable impedance circuit includes at least two junction field-effect transistors having their drain-to-source paths interconnected in a parallel circuit arrangement, and
   the control signals are applied between the gate electrodes of the junction field-effect transistors and a reference voltage.

3. An automatic phase control circuit in accordance with claim 2 wherein
   the two junction field-effect transistors of the variable impedance circuit include a first junction field-effect transistor having a minimum drain-to-source impedance R and a second junction field-effect transistor having a minimum drain-to-source impedance of at least 2R.

4. An automatic phase control circuit in accordance with claim 3 further comprising
   means for receiving different magnitude signals between the respective gate electrodes and the reference voltage, the magnitude of the signal applied to the second junction field-effect transistor being at least twice the magnitude of the signal applied to the first junction field-effect transistor.

5. An automatic phase control circuit in accordance with claim 2 further comprising
   means for receiving different magnitude signals between the respective gate electrodes and the reference voltage, the magnitude of the signal applied to the second junction field-effect transistor being at least twice the magnitude of the signal applied to the first junction field-effect transistor.

* * * * *